US009355544B1

(12) United States Patent
Bean et al.

(10) Patent No.: US 9,355,544 B1

(45) Date of Patent: May 31, 2016

(54) METHOD AND APPARATUS FOR OPTICALLY STORING A BINARY STATE

(75) Inventors: Reginald D. Bean, Center Point, IA (US); Nathaniel P. Wyckoff, Marion, IA (US); Brandon C. Hamilton, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1297 days.

(21) Appl. No.: 13/224,779

(22) Filed: Sep. 2, 2011

(51) Int. Cl.

*G08B 21/00* (2006.01)
*G01R 31/00* (2006.01)
*G01J 1/00* (2006.01)
*G01B 11/00* (2006.01)

(52) U.S. Cl.

CPC .................................... *G08B 21/00* (2013.01)

(58) Field of Classification Search

CPC ...................................................... G08B 21/00
USPC ......................................................... 340/662
See application file for complete search history.

(56) References Cited

U.S. PATENT DOCUMENTS 4,967,152 A * 10/1990 Patterson ............ G01R 31/309 156/345.5
2002/0038199 A1 * 3/2002 Blemel .................... F17D 5/02 702/183

* cited by examiner

*Primary Examiner* — Jennifer Mehmood
*Assistant Examiner* — John Mortell
(74) *Attorney, Agent, or Firm* — Donna P. Suchy; Daniel M. Barbieri

(57) ABSTRACT

A fault indication method for equipment includes receiving a fault signal indicative of a fault of a device; energizing a light emitter based on the received fault indication, in which a luminous material is made to fluoresce based on receipt of light emitted by the light emitter; detecting fluorescence of the luminous material by a light detector, and outputting a voltage and/or current indicative of the fluorescence; and providing a fault output signal when the voltage and/or current exceeds a predetermined value.

21 Claims, 4 Drawing Sheets

METHOD AND APPARATUS FOR OPTICALLY STORING A BINARY STATE

FIELD OF THE INVENTION

The present specification relates to optically storing a binary state indicative of a fault. More particularly, the present specification relates to the use of a luminous material for optical storing a binary state indicative of a fault of a piece of equipment.

In systems susceptible to faults, it is desirable to record a fault event. Typical methods for recording a fault event include writing a fault status to a non-volatile memory device such as a Flash memory or a battery backed random access memory (RAM), or sending a failure alert to a host for subsequent action (i.e., start a repair process to correct the fault). However, in the event that the fault is accommodated with the loss of power, or immediately succeeded by the loss of power, the system may not be able to respond to the fault either by recording the fault or annunciating the fault (e.g., outputting an audible and/or visual alarm). There is therefore a need for an electronic device that can record a fault coincident with the loss of power, and to allow recovery of the fault indication upon a subsequent power-on.

SUMMARY OF THE INVENTION

An exemplary embodiment relates to a fault indication device. The device includes a light emitter configured to emit light when energized. The device also includes a luminous material positioned to receive light from the light emitter and to fluoresce due to reception of the light from the light emitter. The device further includes a light detector configured to detect fluorescence of the luminous material and to output a voltage and/or current indicative of the fluorescence. The device also includes an I/O circuit configured to receive a fault indication and to provide a signal to energize the light emitter, and configured to receive the voltage and/or current output by the light detector and to output a fault output signal when the voltage and/or current exceeds a predetermined value.

Another exemplary embodiment relates to a fault indication method. The method includes receiving a fault signal indicative of a fault of a device. The method also includes energizing a light emitter based on the received fault indication, in which a luminous material is made to fluoresce based on receipt of light emitted by the light emitter. The method further includes detecting fluorescence of the luminous material by a light detector, and outputting a voltage and/or current indicative of the fluorescence. The method still further includes providing a fault output signal when the voltage and/or current exceeds a predetermined value. By way of this method, even if a power loss occurs when the fault occurs, the light detector will be able to detect the fluorescence of the luminous material at some later point in time after the fault occurs and when power is restored, so as to output a fault indication output signal at that later point in time.

Another embodiment related to a computer readable medium storing computer program product that, when executed by a computer, causes the computer to perform a functions of: receiving a fault signal indicative of a fault of the device; energizing a light emitter based on the received fault indication, in which a luminous material is made to fluoresce based on receipt of light emitted by the light emitter; receiving information indicative of fluorescence of the luminous material as output by a light detector; and providing a fault output signal based on the information indicative of the fluorescence. Accordingly, even if a power loss occurs when the fault occurs, the light detector will be able to detect the fluorescence of the luminous material at some later point in time after the fault occurs and when power is restored, so as to output the fault output signal at that later point in time.

BRIEF DESCRIPTION OF THE DRAWINGS

Exemplary embodiments are hereafter described with reference to the accompanying drawings, wherein like numerals denote like elements; and.

DETAILED DESCRIPTION OF THE PREFERRED EMBODIMENTS

Figures 1A, 1B, 1C:
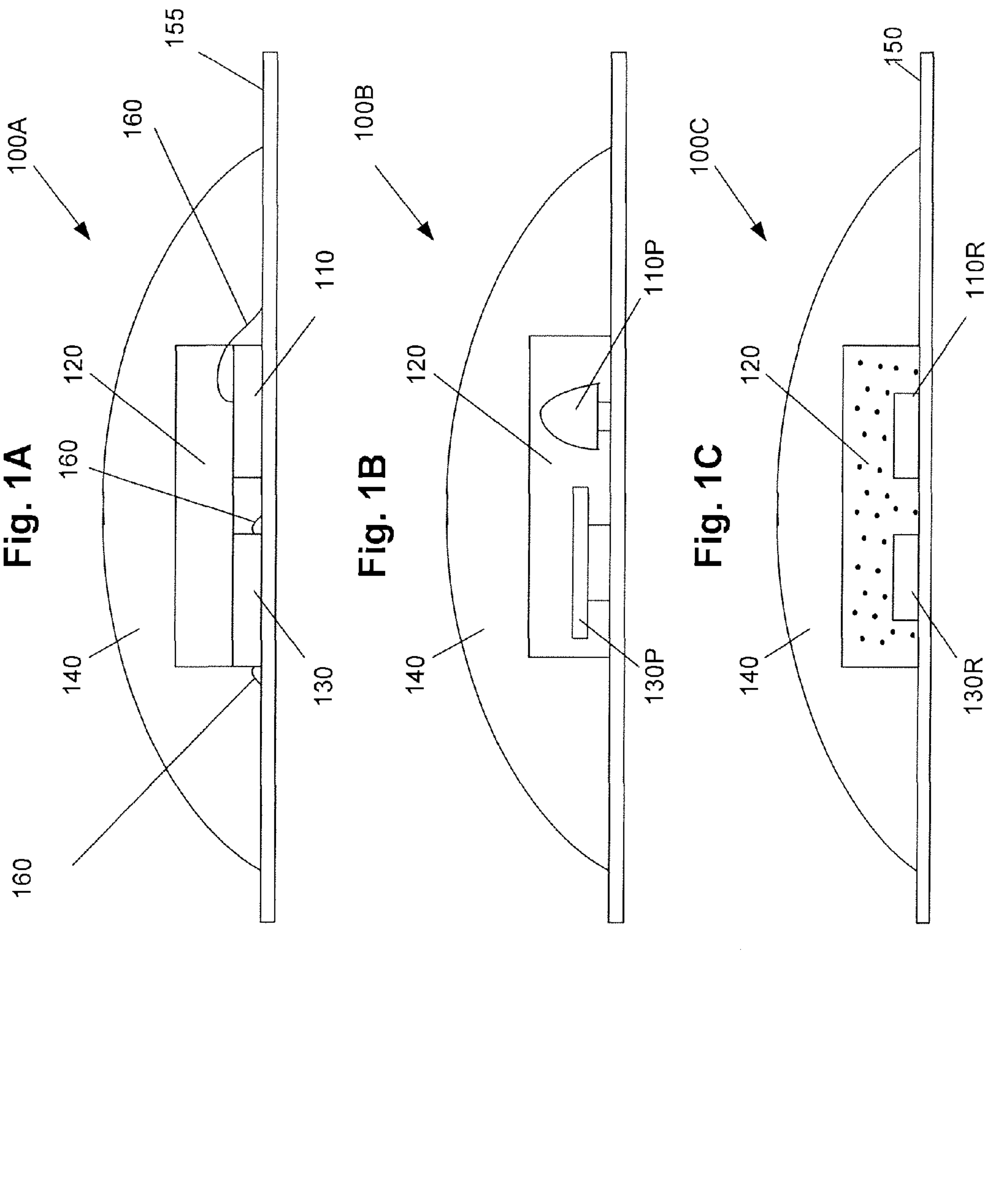
FIG. 1A is a drawing showing elements making up a fault indication device according to an exemplary embodiment.
FIG. 1B is a drawing showing elements making up a fault indication device according to another exemplary embodiment.
FIG. 1C is a drawing showing elements making up a fault indication device according to yet another exemplary embodiment.

Before describing in detail the particular improved system and method, it should be observed that the invention includes, but is not limited to, a novel structural combination of optical components and not in the particular detailed configurations thereof. Accordingly, the structure, methods, functions, control and arrangement of components have been illustrated in the drawings by readily understandable block representations and schematic drawings, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

Embodiments of the invention relate to utilizing a luminous material to capture a binary state indicative of a fault. The luminous material may be a fluorescent, phosphorescent, or persistent luminescence material in some embodiments. When coupled with a light source (or light emitter) and a light detector, the luminous material illuminates when the light source emits light, causing the luminous material to fluoresce. The fluorescence of the luminous material is then detected by the light detector, to result in detection of the as a "fault asserted state." Depending upon the certain properties of the luminous material, the asserted state may be designated to persist for nanoseconds up to several days or even years. Such luminous materials include but are not limited to rare earth and transition metal doped glasses (i.e., rare earth doped phosphate glasses), rare earth and transition metal doped glasses ceramics (i.e., rare earth doped alkaline earth aluminate crystals), quantum dots, organic materials, and self-luminescent materials (i.e., self-luminescent microspheres).

The phenomenon of fluorescence is an optical property of fluorescent materials. When wave packets of photons of a certain wavelength are irradiated on a fluorescent material, its molecules absorb the photons and then emit photons of comparatively longer wavelengths. The energy difference of photons (absorbed and emitted) transforms into light energy, which is detected by the light detector. For example, there are several types of amber and calcite that fluoresce on irradiation by shortwave ultraviolet rays. The Hope Diamond, emeralds, and rubies emit red fluorescence on irradiation by shortwave UV rays. The fluorescent properties of crude oil are used in oil exploration drilling. For examples, heavy oils fluoresce in dull brown color and tar in bright yellow color. Some organic liquids also show fluorescent properties, such as the mixture of anthracene in toluene or benzene fluoresces on irradiation by ultraviolet or gamma rays. With respect to a phosphorescent material, it does not immediately re-emit the radiation it absorbs. The slower time scales of the re-emission are associated with "forbidden" energy state transitions in quantum mechanics. As these transitions occur very slowly in certain materials, absorbed radiation may be re-emitted at a lower intensity for up to several hours after the original excitation. Commonly seen examples of phosphorescent materials are glow-in-the-dark toys, paint, and clock dials that glow for some time after being charged with a bright light such as in any normal reading or room light. Typically the glowing then slowly fades out within minutes (or up to a few hours) in a dark room. Common pigments used in phosphorescent materials include zinc sulfide and strontium aluminate.

FIG. 1A is a drawing showing elements making up a fault indication device 100A according to an exemplary embodiment. In FIG. 1A, upon receipt of a 'Fault In' signal from an equipment, a light emitter 110 is energized to create a light source, which optically charges the luminous material 120. By way of example and not by way of limitation, the light emitter emits light 110 in a visible light band. Alternatively, the light emitter 110 emits light in an infrared band and/or ultraviolet band. In any event, the light emitter 110 is configured to emit light in a frequency band that causes the luminous material 120 to fluoresce. Based on the light emitted by the light emitter 110, the luminous material 120 charges in a manner known to those skilled in the art, so as to fluoresce when a sufficient amount of light is received by the luminous material 120.

After a period of time elapses, the light emitter 110 is turned off. In certain embodiments, output of a fault by a device causes activation of the light emitter 110 for a predetermined amount of time (e.g., 100 microseconds), and is turned off thereafter. However, the luminous material remains illuminated for a given duration after the predetermined period of time in the absence of power. The next time power is applied, a light detector 130 is queried to determine if the luminous material has been illuminated. That is, the light detector 130 is queried to see if it detects light output from the luminous material 120. This query can be done periodically in some embodiments, such as every 0.1 second, every 1 second, every 10 seconds, etc. If a query of the light detector 130 results in detection of light, then a fault indication is output, to indicate that a fault has occurred and needs to be rectified. In the embodiment shown in FIG. 1A, the light emitter 110 and the light detector 130 are surface mount devices, which are connected to a surface 155 of a chip via bond wires 160. The chip that contains the elements shown in FIG. 1A can be mounted on a printed circuit board, for example.

FIG. 1A also shows an overmold 140 provided over the components making up the fault indication storage device 100. The overmold 140 is provided to sufficiently protect the components, so that they will last for a sufficiently long period of time, such as the expected life of the device for which the fault indication storage device 100 is used to detect faults output therefrom. By way of example and not by way of limitation, the overmold 140 is manufactured from an epoxy or silicone material, and provides several thousandths of an inch to inches of protective cover over the components making up the fault indication storage device 100. By way of example and not by way of limitation, the overmolding material may include any combination of dielectric elastomers to include silicone, polyurethane, acrylic, fluoropolymers, and or epoxy resin systems. Epoxy encapsulants may include diglycidyl ether of bisphenol A, diglycidyl ether of bisphenol F, cycloaliphatic novolac resins or any combination thereof or adduct of said resins. Resins systems may be cured in combination with one or more curing agents or hardeners to include amines, amides, polyamides, acid anhydrides, alcohols, and or any combination of or hybridization of conventional curing agents utilized for the purpose of cross-linking resins. Resin systems may also include a hybridization of chemistries including acrylated epoxy resins, acrylated polyurethane resins, or exopidized silicones. Silicone resins may include any silicone resin with polydimethylsiloxane (PDMS) repeating units manufactured from tetraethoxy silane, chlorosilanes and or related compounds. Polyurethane elastomers may include aromatic, aliphatic, or cycloaliphatic resins such as toluene diisocyanate (TDI), 4,4' diphenylmethane diisocyanate (MDI), hexamethylene diisocyanate (HDI), isophorone diisocyanate (IPDI), methylene bis (4-cyclohexylisocyanate) (HMDI) or the likes. The polyurethane isocyanate resins may be cross linked by one or any combination of curing agents to include amines, amides, epoxies, or alcohols (polyols). Common polyol hardeners include polyoxypropylene glycol (PPG), polytetramethylene ether glycol (PTMEG), polybutadiene (poly BD), and polyesters including adipates, polycaprolactones, and castor oil. These material may be applied as a one component premixed system or as a two component system requiring blending an deairation prior to filling and applying. Commercially available epoxy and silicone resin systems for encapsulating light emitting diodes include Henkel Hysol OS1600, OS4000, and NuSil LS-1246, LS-6946, LS2-6941, and LS-3440.

The fault indication storage device 100A may be of small size as to be incorporated at the wafer or die level. Alternatively, the fault indication storage device 100 may be relatively large in size with physical dimensions on the order of inches. FIG. 1B shows another embodiment of a fault indication storage device 100B using axial leaded components, with a light emitter 110P, light detector 130P, luminous material 120, and overmold 140 provided over (and thus covers) the light emitter 110P, the light detector 130P, and the luminous material 120. FIG. 1C shows yet another embodiment of a fault indication storage device 100C that corresponds to a die level configuration. In the embodiment shown in FIG. 1C, a light emitter die 110R and a light detector die 130R are attached to luminous material 120 and to an interposer 150.

In the embodiment of FIG. 1C, the luminous material 120 includes filler material with luminous particles (shown as dots in FIG. 1C) suspended in the filler material. In the embodiment of FIG. 1C, the filler material is loaded less than 0.25% parts by weight (PBW), since otherwise it may result in significant reduction of light transmission. The filler material offers highly efficient diffuse reflection and diffuse interflection at low loading levels (e.g., less than 0.25% PBW), which is advantageous. Filler materials that may be utilized in the embodiment of FIG. 1C include silica, fused silica, barium sulfate, calcium carbonate, aluminium oxide, clay, glass fibers, magnesium silicate hydrate, titanium dioxide, alumina trihydrate, zinc borate hydrate, zinc oxide, alkali aluminosilicate, spherical fused silica, antimony pentoxide, TEFLON™, ground glass, or mica. Also, in the embodiment of FIG. 1C, an overmold 140 is provided over (and thus covers) the light emitter die 110R, the light detector die 130R, and the luminous material 120.

In each of the embodiments shown in FIGS. 1A, 1B and 1C, the overmold 140 serves the function of protecting the luminous material 120 from an outside light source which could falsely trigger (illuminate) the luminous material. In some embodiments, the overmold is opaque to thereby block outside light from effecting the luminous material 120, thereby preventing a false trigger.

Figure 2A:
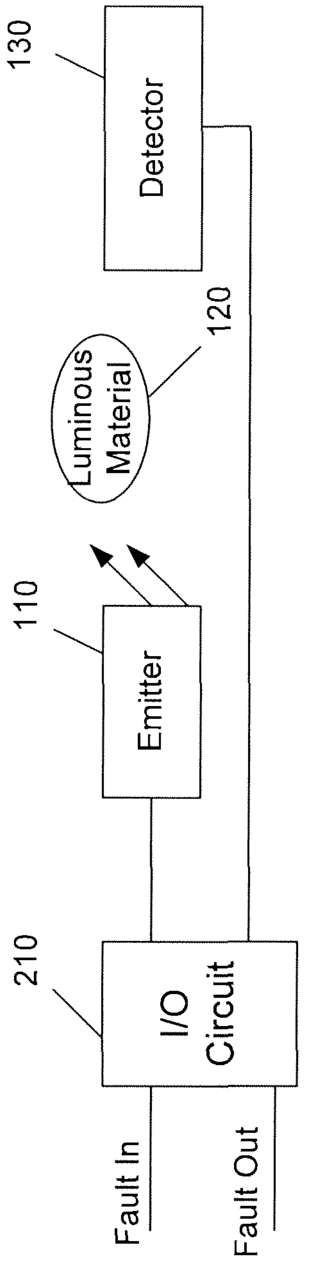
FIG. 2A is a block drawing showing signal connectivity between some of the elements of a fault indication device according to an exemplary embodiment.

FIG. 2A depicts an electrical circuit for storing and outputting a fault indication, consistent with the embodiments shown in FIGS. 1A, 1B and 1C. The light emitter 110 and the light detector 120 are electrically connected to an Input/Output (I/O) circuit 210. The I/O circuit 210, upon receipt of a fault (shown as a Fault Indication signal, or "Fault In", in FIG. 2), such as from a fault sensor provided on a piece of equipment, provides a signal to the light emitter 110 to cause the light emitter 110 to turn on for a predetermined time period. In certain embodiments, the I/O circuit outputs a series of pulses to the light emitter 110, to cause it to output light for a duration corresponding to the series of pulses. The light emitter 110 illuminates the luminous material 120 (see FIGS. 1A, 1B, and 1C), and causes it to fluoresce. The fluorescence of the luminous material will be detected by the light detector 130, which, when queried by the I/O circuit 210, output a light detection signal. The I/O circuit 210 outputs a fault indication signal upon receipt of the light detection signal from the light detector 130. The fault indication signal can then be provided to other devices, such as fault repair circuitry, and/or rerouting circuitry, to deal with the fault in an appropriate manner.

Figure 2B:
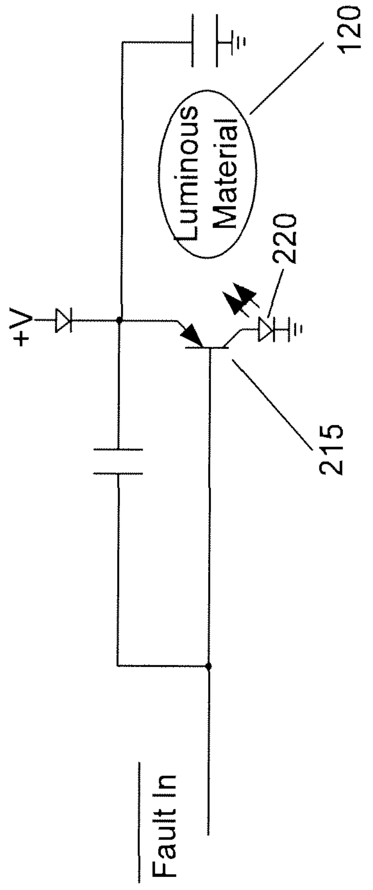
FIG. 2B shows a circuit configuration of a portion of the electrical circuit of FIG. 2A according to an exemplary embodiment.

FIG. 2B shows a circuit configuration of fundamental components of the electrical circuit of FIG. 2A that causes the luminous material to fluoresce upon reception of a Fault Indication ("Fault In") signal, consistent with embodiments of the invention (whereby FIG. 2B does not show non-fundamental components such as resistors to control current or circuitry to prevent false positives during power up/power down). The Fault In signal is received by a gate terminal of a transistor 215, thereby causing the transistor 215 to turn ON, which in turn causes a light emitting diode (LED) 220 connected to a collector terminal of the transistor 215 to turn ON (due to current being provided to the LED 220 from the transistor 215). The light from the LED 220 is received by the luminous material 120 and causes it to fluoresce. One of ordinary skill in the art will recognize that other circuit configurations than the one shown in FIG. 2B can be used to activate the luminous material upon receipt of a Fault Indication signal, while remaining within the spirit and scope of the invention.

In certain embodiments, the light emitter 110 is turned on for several seconds, which is the amount of time needed to fully fluoresce the luminous material 120. For example, a light emitter having a light output of 10 lumens would be adequate to sufficiently charge a luminous material of rare earth doped alkaline earth aluminate crystal type in a time of 10 seconds. Other luminous materials include but are not limited to ZnS:Cu (copper activated zinc sulfide), $Zn_2SiO_4$:Mn, ZnS:Ag+(Zn, Cd)S:Ag, ZnS:Ag+ZnS:Cu+$Y_2O_2S$:Eu, ZnO:Zn, KCl, ZnS:Ag, Cl or ZnS:Zn, (KF, MgF2):Mn, (Zn, Cd)S:Ag or (Zn, Cd)S:Cu, $Y_2O_2S$:Eu+$Fe_2O_3$, ZnS:Cu, Al, ZnS:Ag+Co-on-$Al_2O_3$, (KF, $MgF_2$):Mn, (Zn, Cd)S:Cu, Cl, ZnS:Cu or ZnS:Cu, Ag, $MgF_2$:Mn, (Zn, Mg)$F_2$:Mn, Zn2SiO4:Mn, As, ZnS:Ag+(Zn, Cd)S:Cu, $Gd_2O_2S$:Tb, $Y_2O_2S$:Tb, $Y_3Al_5O_{12}$:Ce, $Y_2SiO_5$:Ce, $Y_3Al_5O_{12}$:Tb, ZnS:Ag, Al, ZnS:Ag, ZnS:Cu, Al or ZnS:Cu, Au, Al, (Zn, Cd)S:Cu, Cl+(Zn, Cd)S:Ag, Cl, $Y_2SiO_5$:Tb, $Y_2O_5$:Tb, $Y_3$(Al, Ga)$_5O_{12}$:Ce, $Y_3$(Al, Ga)$_5O_{12}$:Tb, $InBO_3$:Tb, $InBO_3$:Eu, $InBO_3$:Tb+$InBO_3$:Eu, $InBO_3$:Tb+$InBO_3$:Eu+ZnS:Ag, (Ba, Eu)$Mg_2Al_{16}O_{27}$, (Ce, Tb)$MgAl_{11}O_{19}$, $BaMgAl_{10}O_{17}$:Eu, Mn, $BaMg_2Al_{16}O_{27}$:Eu(II), $BaMgAl_{10}O_{17}$:Eu, Mn, $BaMg_2Al_{16}O_{27}$:Eu(II), $Ce_{0.67}Tb_{0.33}MgAl_{11}O_{19}$:Ce, Tb, $Zn_2SiO_4$:Mn, $Sb_2O_3$, $CaSiO_3$:Pb, Mn, $CaWO_4$ (Scheelite), $CaWO_4$:Pb, $MgWO_4$, (Sr, Eu, Ba, Ca)$_5(PO_4)_3$Cl, $Sr_5Cl(PO_4)_3$:Eu(II), (Ca, Sr, Ba)$_3(PO_4)_2Cl_2$:Eu, (Sr, Ca, Ba)$_{10}(PO_4)_6Cl_2$:Eu, $Sr_2P_2O_7$:Sn(II), $Sr_6P_5BO_{20}$:Eu, $Ca_5F(PO_4)_3$:Sb, (Ba, Ti)$_2P_2O_7$:Ti, $_3Sr_3(PO_4)_2$SrF:Sb, Mn, $Sr_5F(PO_4)_3$:Sb, Mn, $Sr_5F(PO_4)_3$:Sb, Mn, $LaPO_4$:Ce, Tb, (La, Ce, Tb)$PO_4$, (La, Ce, Tb)$PO_4$:Ce, Tb, $Ca_3(PO_4)_2.CaF_2$:Ce, Mn, (Ca, Zn, Mg)$_3(PO_4)_2$:Sn. The I/O circuit 210 additionally has capacitive holdup circuitry, which can be used to power the light emitter 110 in the event power fails coincident with a Fault In. That way, the capacitive holdup circuitry will provide sufficient power, upon loss of primary power, to fully fluoresce the luminous material 120 to an asserted state coincident with the assertion of Fault In immediately followed by loss of power.

To read the state of the luminous material 120, the I/O circuit 210 energizes the light detector 130, e.g., periodically every 1 second or every 10 seconds, and takes an analog voltage reading output from the light detector 130 to be compared against a threshold value (stored in the I/O circuit 210). If the light detector 130 output voltage is above the threshold, then a Fault Out is indicated, and thereby output by the I/O circuit 210.

Figure 3:
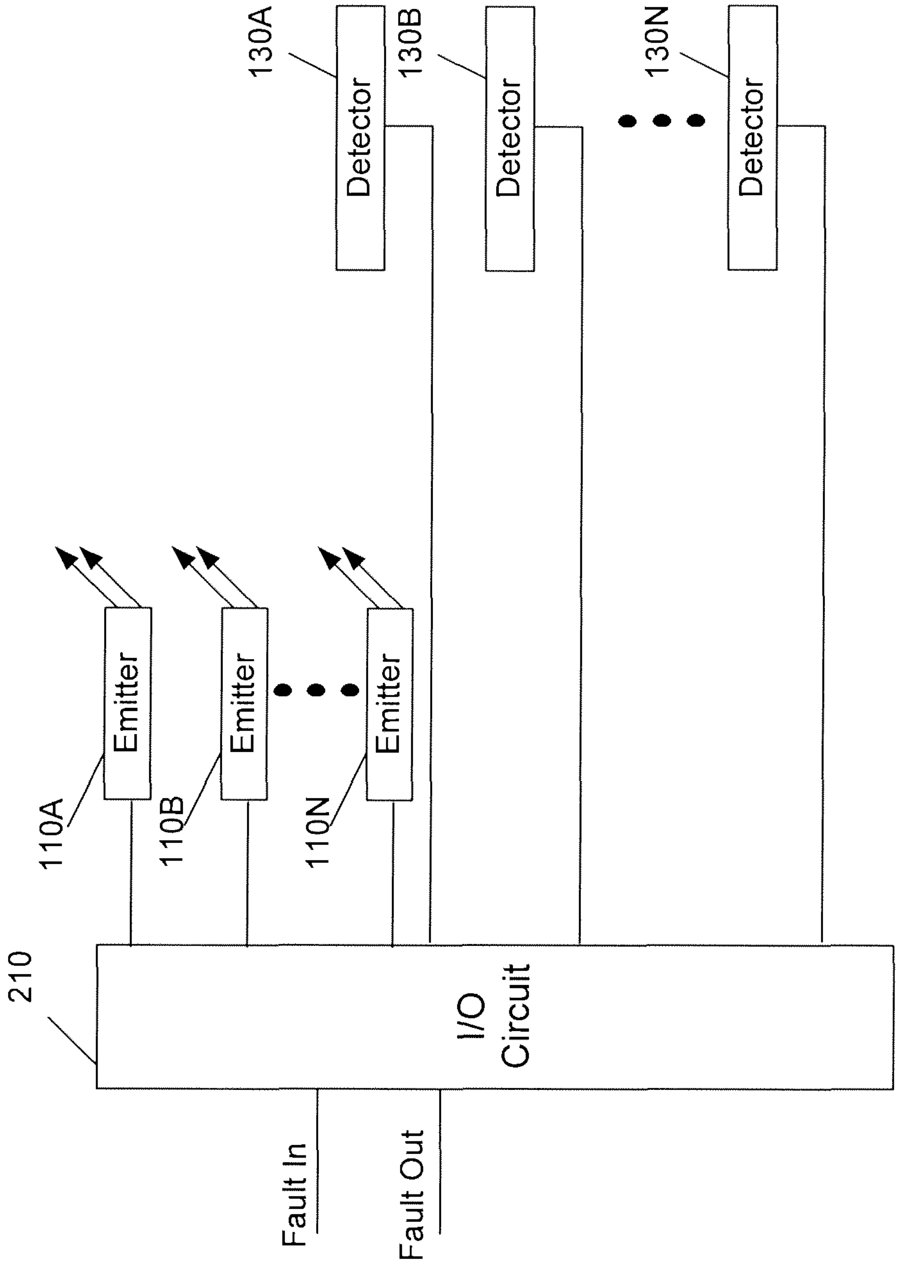
FIG. 3 is a block diagram showing signal connectivity between some of the elements of a fault indication device according to another exemplary embodiment.

In some other embodiments, an array of emitter-detector pairs are utilized to create a counter. In instances where a piece of equipment powers on just long enough to begin a built-in-test (BIT) sequence, and then trips a fault resulting in an equipment power-cycle, a counter in accordance with these other embodiments counts the repeated attempts, and then locks the equipment off while annunciating an alert if the repeated attempts have not removed the fault. FIG. 3 shows one possible implementation of these other embodiments. An I/O circuit 210 is connected to a plurality of light emitters 120A, 120B, . . . , 120N, and to a plurality of light detectors 130A, 130B, . . . , 130N. When a first Fault In is received by the I/O circuit 210, the I/O circuit 210 outputs a pulse of sufficient duration to energize the first light emitter 120A so as to adequately fluoresce the luminous material 120, whereby the first light emitter 120A illuminates a first luminous material (not shown), and which light fluoresced therefrom is detected by the first light detector 130A. The I/O circuit 210 sets a count value to One (1), and outputs a Fault Out signal. If a second Fault In is received by the I/O circuit 210 within a predetermined time from when the first Fault In was received (e.g., within one minute), the I/O circuit 210 then outputs a pulse of sufficient duration to energize the second light emitter 120B, which illuminates a second luminous material (not shown), and which light fluoresced therefrom is detected by the second light detector 130B. The I/O circuit 210 increases the count value to Two (2), and outputs a Fault Out signal. This process is repeated until the count value reaches a predetermined value (e.g., 5), at which time the equipment is locked from being power-cycled, and whereby a repair technician is notified to try to fix the problem with the equipment. This notification can be made by way of a separate Fault indication (Serious Fault indication signal) output by the I/O circuit 210 when the count exceeds the predetermined value. The serious fault indication signal can be issued as one or more or an automatic telephone call to a repair technician, and/or an email to a repair technician indicating the equipment that needs repairing, and/or an audible alarm.

Figure 4:
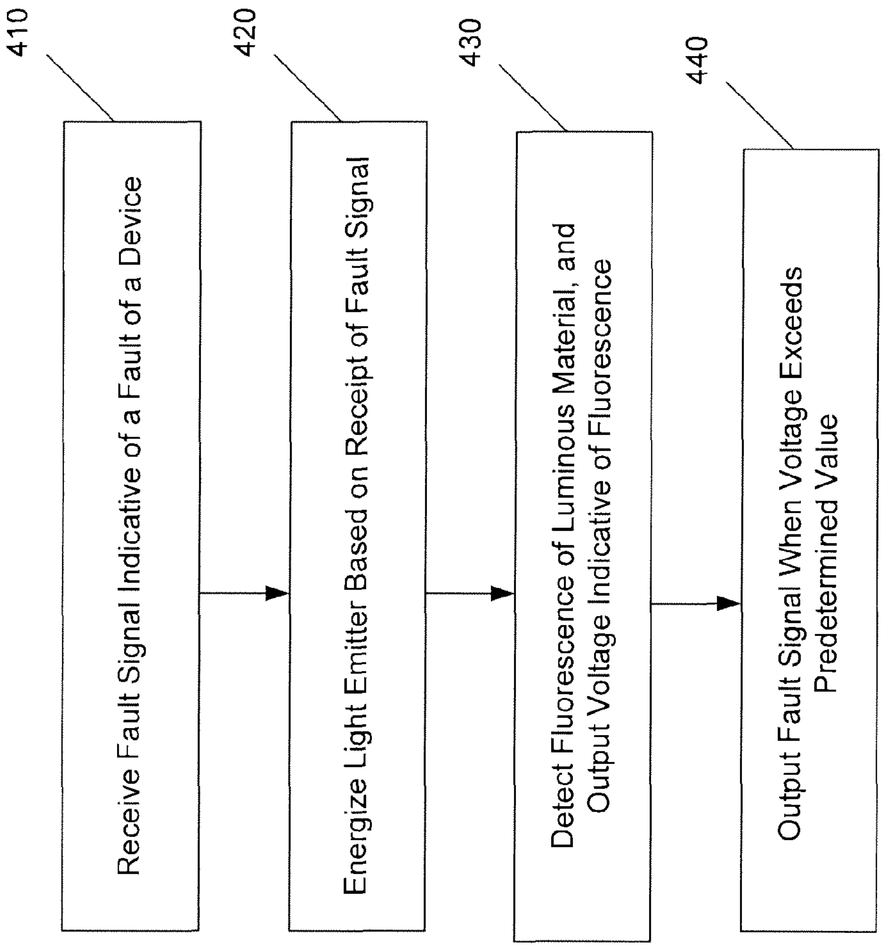
FIG. 4 is a flow chart showing steps in a method according to an exemplary embodiment.

FIG. 4 is a flow diagram showing steps in a fault indication method according to one or more embodiments. In a first step 410, a fault signal indicative of a fault of a device is received by an I/O device. In a second step 420, a light emitter is energized by the I/O device based on the received fault indication, in which a luminous material is made to fluoresce based on receipt of light emitted by the light emitter. In a third step 430, fluorescence of the luminous material is detected by a light detector, and a voltage indicative of the fluorescence is output to the I/O device. In a fourth step 440, a fault signal is output by the I/O device when the voltage exceeds a predetermined value.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of optical component, dimensions and angles are mentioned, other components, dimensions and angles can be utilized. Also, while activation of the light emitter is described by providing at least one pulse to it, the light emitter can remain On after the pulse has been received, in which the light emitter stays On until power is removed from it. Various changes may be made to the details disclosed without departing from the spirit of the invention which is defined by the following claims.

What is claimed is:

1. A fault indication device, comprising:

a light emitter configured to emit light when energized;

a luminous material positioned to receive light from the light emitter and to fluoresce due to reception of the light from the light emitter;

a light detector configured to detect fluorescence of the luminous material and to output a light detection signal indicative of the fluorescence; and an I/O circuit configured to receive a fault indication and to provide a signal to energize the light emitter based on the received fault indication, and configured to receive a voltage and/or current output by the light detector and to output a fault output signal when the light detection signal exceeds a predetermined value.

2. The fault indication device according to claim 1, wherein the luminous material corresponds to a phosphorescent or persistent luminescence material.

3. The fault indication device according to claim 1, further comprising:

an overmold provided over the light emitter, the luminous material, the light detector, and the I/O circuit.

4. The fault indication device according to claim 1, wherein the signal provided to the light emitter corresponds to at least one pulse that is configured to activate the light emitter.

5. The fault indication device according to claim 1, wherein the I/O circuit includes a comparator configured to compare the voltage output by the light detector with a threshold value indicated of the predetermined value.

6. The fault indication device according to claim 1, wherein the I/O circuit comprises:

capacitive holdup circuitry configured to receive and hold an input to the I/O circuit in the event of power loss to the I/O circuit.

7. The fault indication device according to claim 1, wherein the luminous material includes luminous particles suspended in a filter material.

8. A fault indication method, comprising:

receiving a fault signal indicative of a fault of a device;

energizing a light emitter based on the received fault indication, in which a luminous material is made to fluoresce based on receipt of light emitted by the light emitter;

detecting fluorescence of the luminous material by a light detector, and outputting a voltage and/or current indicative of the fluorescence; and providing a fault output signal when the voltage and/or current exceeds a predetermined value.

9. The method according to claim 8, wherein the luminous material corresponds to a fluorescent, phosphorescent, or persistent luminescence material.

10. The method according to claim 8, further comprising:

providing an overmold over the light emitter, the luminous material, the light detector, and the I/O circuit.

11. The method according to claim 8, wherein the signal provided to the light emitter corresponds to at least one pulse that is configured to activate the light emitter.

12. The method according to claim 8, wherein the providing step comprises:

comparing the voltage output by the light detector with a threshold value indicated of the predetermined value.

13. The method according to claim 8, wherein the providing step comprises:

receiving and holding, by capacitive holdup circuitry, an input to the I/O circuit in the event of power loss to the I/O circuit.

14. The method according to claim 8, wherein the luminous material includes luminous particles suspended in a filter material.

15. A non-transitory computer readable medium storing computer program code, which, when executed by a computer, causes the computer to operate as a fault indication device by performing the functions of:

receiving a fault signal indicative of a fault of a device;

outputting a signal to energize a light emitter based on the received fault indication, in which a luminous material is made to fluoresce based on receipt of light emitted by the light emitter;

receiving a signal indicative of detected fluorescence of the luminous material by a light detector, and outputting a voltage and/or current indicative of the fluorescence; and providing a fault output signal when the voltage and/or current exceeds a predetermined value.

16. The non-transitory computer readable medium according to claim 15, wherein the luminous material corresponds to a fluorescent, phosphorescent, or persistent luminescence material.

17. The non-transitory computer readable medium according to claim 15, wherein an overmold is provided over the light emitter, the luminous material, the light detector, and an I/O circuit.

18. The non-transitory computer readable medium according to claim 15, wherein the signal provided to the light emitter corresponds to at least one pulse that is configured to activate the light emitter.

19. The non-transitory computer readable medium according to claim 17, wherein the I/O circuit includes a comparator configured to compare the voltage and/or current output by the light detector with a threshold value indicated of the predetermined value.

20. The non-transitory computer readable medium according to claim 17, the computer further performing the step of: receiving and holding an input to the I/O circuit in the event of power loss to the I/O circuit.

21. The non-transitory computer readable medium according to claim 15, wherein the luminous material includes luminous particles suspended in a filter material.

* * * * *